(12) United States Patent
Sedigh et al.

(10) Patent No.: US 6,893,974 B1
(45) Date of Patent: May 17, 2005

(54) SYSTEM AND METHOD FOR FABRICATING OPENINGS IN A SEMICONDUCTOR TOPOGRAPHY

(75) Inventors: Mehran Sedigh, Campbell, CA (US); Saurabu Dutta Chowdhury, Belmont, CA (US)

(73) Assignee: Cypress Semiconductor Corp., San Jose, CA (US)

( * ) Notice: Subject to any disclaimer, the term of this patent is extended or adjusted under 35 U.S.C. 154(b) by 316 days.

(21) Appl. No.: 10/235,160

(22) Filed: Sep. 5, 2002

(51) Int. Cl.⁷ .............................................. H01L 21/302
(52) U.S. Cl. ..................... 438/714; 438/4; 438/637; 438/706; 156/345.24
(58) Field of Search ............................... 438/5, 9, 637, 438/638, 700, 706, 710, 712, 714, 720; 216/47, 67, 41; 156/345.24

(56) References Cited

U.S. PATENT DOCUMENTS

| 6,069,090 A | * | 5/2000 | Eriguchi ..................... 438/714 |
| 6,248,602 B1 | | 6/2001 | Bode et al. |
| 6,372,634 B1 | | 4/2002 | Qiao et al. |
| 6,376,262 B1 | | 4/2002 | Kempa et al. |
| 6,410,357 B1 | * | 6/2002 | Chang et al. .................. 438/16 |
| 6,635,185 B2 | * | 10/2003 | Demmin et al. .............. 216/64 |

* cited by examiner

Primary Examiner—Lan Vinh
(74) Attorney, Agent, or Firm—Kevin L. Daffer; Mollie E. Lettang; Daffer McDaniel, LLP

(57) ABSTRACT

A system and method is provided herein to fabricate openings in a semiconductor topography using feed forward control of etch process parameters. In one embodiment, a method includes measuring one or more dimensional features of a semiconductor topography to obtain pre-etch values. The method also includes determining a statistical result of the pre-etch values and adjusting one or more processing parameters if the statistical result is less than a target value. Subsequently, the method includes etching the semiconductor topography based upon the statistical result to form one or more openings in the semiconductor topography. As such, the system and method described herein fabricates openings using feed forward control of the etch process parameters to compensate for structural variations within semiconductor topographies that may exist between wafer-to-wafer and/or between lot-to-lot. In this manner, the system and method advantageously fabricates openings having profiles and dimensions, which exhibit little to no deviation from a design specification.

21 Claims, 5 Drawing Sheets

SYSTEM AND METHOD FOR FABRICATING OPENINGS IN A SEMICONDUCTOR TOPOGRAPHY

BACKGROUND OF THE INVENTION

1. Field of the Invention

This invention relates to semiconductor device manufacturing and, more particularly, to an improved system and method for fabricating contact openings in a semiconductor topography.

2. Description of the Related Art

The following descriptions and examples are given as background only.

At various stages in the fabrication of semiconductor devices, it is often necessary to form openings in an inter-level dielectric layer to allow for contact to underlying regions or layers. Generally, an opening through a dielectric layer that exposes a diffusion region, or an opening through a dielectric layer between polysilicon and a first metal layer is called a "contact opening" or a "contact hole." Conversely, an opening through other dielectric layers such as an opening through an inter-metal dielectric layer is generally referred to as a "via." For purposes of this disclosure, however, the term "opening" may be used herein to refer to a contact opening and/or a via. As such, an opening may expose a diffusion region within the semiconductor substrate, such as a source or drain region, or may expose other layers or structures, such as an underlying metallization layer, a local interconnect layer, or a gate structure. Subsequently, a contact structure may be formed within the opening by filling the opening with a conductive material to electrically contact the underlying region or layer. In other cases, however, openings may be fabricated to form other structures, such as isolation regions or gate structures, for example.

As the densities of semiconductor devices are continually increased, profile and dimension requirements of semiconductor device features, such as contact structures, must be optimized. In some cases, the amount of space a contact structure consumes may be minimized to increase the density of semiconductor devices. In such a case, it may be desirable for an opening to be formed having sidewalls that are substantially perpendicular to an upper surface of a semiconductor substrate. As such, the sidewall angle of the opening may be at a 90° angle with respect to the upper surface of the semiconductor substrate. Such an opening may exhibit top and bottom lateral dimensions that are substantially uniform. In this manner, a contact structure may be formed within the opening, which may have predictable and desirable dimensions and electrical properties.

In addition, the lateral dimensions of semiconductor features, such as contact structures, may be reduced to increase the density of devices on a semiconductor substrate. Generally, however, the height of semiconductor features may not be reduced in proportion to the lateral dimensions. In this manner, the aspect ratio of semiconductor features may be higher for advanced semiconductor devices that are designed having high device densities. An aspect ratio, as used herein, generally refers to the ratio between the height and width of a semiconductor feature when viewed in cross section. As the aspect ratio of a contact structure increases, it may become increasingly difficult to form openings that maintain acceptable critical dimensions. For example, a high aspect ratio contact structure may be formed having a sidewall angle that deviates substantially from 90° with respect to an upper surface of the semiconductor substrate. In such an example, a bottom lateral dimension of the opening may be smaller than an acceptable critical dimension.

The term "critical dimension," as used herein, generally refers to the dimensional design value of a semiconductor feature. In some cases, critical dimensions may represent the smallest dimension that may be formed on a semiconductor topography using various fabrication techniques, such as photolithography and etching techniques. In other cases, however, critical dimensions may represent the smallest dimension of a semiconductor feature that maintains optimal operating characteristics of that feature. For example, as stated above, a high aspect ratio opening may be formed having a bottom lateral dimension, which is smaller than an acceptable critical dimension. Such a small bottom lateral dimension may reduce the contact area of the contact structure formed within the opening. A reduction in contact area may lead to numerous problems including, but not limited to, increased electrical resistance between the contact structure and the underlying conductive region or layer. Such an increase in resistance may further lead to a decrease in the speed and reliability of the semiconductor device.

There are several conventional methods for forming contact structures. For example, an opening may be etched through a dielectric layer to expose an underlying region or layer, such as a diffusion region in a semiconductor substrate or a metal interconnect layer. To fully etch the opening without destroying the underlying layer, an etch chemistry may be used which may be selective to the material composition of the underlying layer. As such, the etch chemistry may exhibit a slow etch rate with respect to the material composition of the underlying layer, and a fast etch rate with respect to the material composition of the dielectric layer.

There are, however, several disadvantages to using a selective etch chemistry for forming a contact structure. For example, a selective etch chemistry may deposit a passivating material, such as a polymeric residue or another by-product of the etch process, on the sidewalls of the opening. As such, the use of a selective etch chemistry may cause significant tapering in the sidewall surfaces of the opening. During an etch process, for example, the sidewalls at the top of the opening may be coated with a progressively thicker polymeric residue than the sidewalls at the bottom of the opening. Such an uneven build-up of polymeric residue may shadow the bottom of the opening, thereby resulting in a progressively smaller bottom lateral width of the opening as the etch process continues. After termination of the etch process, the layer of passivating material formed upon the sidewall surfaces of the contact opening may generally be removed using a wet etch process prior to any further processing. However, such passivating materials may be difficult, if not impossible, to remove when an opening with significantly tapered sidewall surfaces is formed having a high aspect ratio. In general, a high aspect ratio may describe a feature, such as an opening, which has a substantially larger height than a width when viewed in cross-section. In some cases, an aspect ratio approximately greater than or equal to 4:1 may be considered a high aspect ratio. In other cases, a high aspect ratio may be approximately greater than or equal to 5:1.

Alternatively, an opening may be formed using an etch chemistry that is not selective to an underlying layer. As such, the etch chemistry may exhibit substantially the same etch rate with respect to the material compositions of the dielectric layer and the underlying layer. Therefore, to etch an opening through the dielectric layer without destroying the underlying layer, as described above, an etch stop layer may be formed between the dielectric layer and the underlying layer. In such a case, the etch chemistry is used to etch through the dielectric layer to the etch stop layer. Complete removal of the etch stop layer, however, is necessary to obtain electrical contact between the contact structure and the underlying layer. Therefore, after etching the opening through the dielectric layer, a second etch process may be performed to remove the remainder of the etch stop layer.

There are, however, several disadvantages to using an etch stop layer for forming a contact structure. For example, using an etch stop layer may reduce the bottom lateral dimension of a contact opening below an acceptable critical dimension. In some cases, the second etch process may insufficiently remove the etch stop layer from sidewall surfaces of the contact opening. In this manner, remaining portions of the etch stop layer may reduce the bottom lateral dimension of the contact opening. As stated above, a small bottom lateral dimension reduces the contact area of the subsequently formed contact structure, which disadvantageously leads to an increase in electrical resistance and a decrease in the speed and reliability of the semiconductor device.

In addition, using an etch stop layer disadvantageously increases the number of steps in a manufacturing process. As such, the complexity of the overall manufacturing process may be increased, making fabrication of a semiconductor device more difficult to accomplish. In particular, process yield may also be decreased because the addition of one or more process steps may result in a higher probability of forming defects in the semiconductor device. Furthermore, the semiconductor device fabrication may require a longer time period due to the additional process steps. In this manner, overall cost of fabricating a semiconductor device may increase, and manufacturing capacity may be decreased. Moreover, deposition of an etch stop layer may require additional high-temperature processes, which may undesirably alter the properties of structures formed within semiconductor devices. As such, increasing the number of temperatures cycles may produce less robust devices, increased contact resistance, and may prevent the formation of smaller device features.

Therefore, it would be advantageous to develop a system and method for forming openings having substantially perpendicular sidewalls, a high aspect ratio, and acceptable critical dimensions. In particular, it may be advantageous to develop a system and method for etching openings without the use of an etch stop layer to protect underlying layers.

SUMMARY OF THE INVENTION

The problems outlined above may be in large part addressed by a system and method for fabricating openings within a semiconductor topography. In some embodiments, the openings may be formed within a dielectric layer to expose a diffusion region within the semiconductor substrate, such as a source or drain region, or may expose other layers or structures, such as an underlying local interconnect layer or gate structure. In such an embodiment, a subsequently formed contact structure may be a diffusion contact, a metal interconnect, or a gate contact. The contact structure may also be fabricated in close proximity to a structure to form a self-aligned contact structure. In other embodiments, openings may be fabricated to form other structures, such as isolation regions or gate structures, for example. In addition, the openings may be formed having a length substantially greater than a width, in some cases. For example, the openings may demonstrate a ratio of length to width of substantially greater than 4:1. As such, the method provided herein may form openings having substantially high aspect ratios.

In general, the system and method described herein provides a means for controlling the formation of various openings. In particular, the system and method provides feed forward control of an opening etch process, which allows processing parameters to be dynamically updated prior to etching one or more semiconductor topographies. Preferably, the system and method updates the processing parameters prior to etching a single wafer, such that variations of dimensional features within semiconductor topographies of the single wafer can be controlled on a wafer-by-wafer basis. In this manner, feed forward control compensates for structural variations, such as variations in the thickness of a layer, to subsequently form openings having profiles and dimensions, which exhibit little to no deviation from a design specification. More specifically, the system and method provides a means for fabricating high aspect ratio openings having substantially perpendicular sidewalls and minimum acceptable critical dimensions. As such, the system and method provides a means for subsequently forming semiconductor devices that exhibit a substantial increase in speed and reliability over conventional devices. In addition, the system and method provides a means for reducing the number of processing steps and/or the amount of processing time over conventional methods. In this manner, the system and method decreases the occurrence of defects, increases manufacturing capacity, and decreases the overall cost of fabricating a semiconductor device.

In one embodiment, a method is provided for fabricating one or more openings in a semiconductor topography. Prior to etching the one or more openings, the method includes measuring one or more dimensional features of the semiconductor topography to obtain pre-etch values. In some cases, the step of measuring includes measuring a thickness of a layer within the semiconductor topography. For example, the method may include measuring a thickness of a layer through which the one or more openings are subsequently formed. In other cases, however, the step of measuring includes measuring a width of a gap within a patterned masking layer of the semiconductor topography. In yet other cases, the step of measuring includes measuring a thickness of a layer and measuring a width of a gap in a patterned masking layer formed over the layer.

Subsequently, the method includes determining a statistical result of the pre-etch values and etching the semiconductor topography based on the statistical result to form the one or more openings in the semiconductor topography. In some cases, such a statistical result represents an average, or mean value of the measured pre-etch values for the one or more openings. In other cases, however, the statistical result may represent a median pre-etch value, a range of pre-etch values, or any other appropriate statistical comparison of the measured pre-etch values.

Prior to the step of etching, the method may further include adjusting one or more processing parameters based on the statistical result. The step of adjusting may be performed upon determining that the statistical result is substantially less than a target value. Such target values may be selected based on dimensions of the particular semiconductor feature to be fabricated and the processing parameters used to fabricate such a feature. In some cases, the step of adjusting one or more processing parameters may include adjusting the etch process chemistry. In other cases, however, the step of adjusting one or more processing parameters may include adjusting the etch process time. Alternatively, the method may include adjusting the etch process chemistry and the etch process time, prior to etching the layer.

Subsequent to the step of etching, the method may further include measuring a bottom lateral width of the one or more openings formed in the semiconductor topography for the purposes of obtaining post-etch values. In addition, or alternatively, the method may include measuring a post-etch thickness of the etched layer and/or measuring a post-etch top lateral width of the one or more openings. Furthermore, the method may include de ter mining a statistical result of the post-etch values, and comparing such a result to the statistical result of the pre-etch values. In this manner, the step of comparing gradually reduces the variation between the desired results and the processing results, thereby incrementally refining the amount by which the processing parameters are adjusted prior to etching a subsequent semiconductor topography. As such, the method advantageously reduces the amount by which dimensions of subsequently formed openings vary from desired dimensions.

Another method for fabricating one or more openings in a semiconductor topography is also provided herein. Similar to the previous embodiment, such a method includes measuring one or more dimensional features of the semiconductor topography to obtain pre-etch values, and determining a statistical result of the measured pre-etch values. As stated above, such pre-etch values may be obtained by measuring a thickness of a layer within the semiconductor topography and/or by measuring a width of a gap in a patterned layer used to mask the layer during an etch process.

Subsequently, the method includes etching a first portion of a layer within the semiconductor topography using a first set of etch parameters. In addition, the method further includes etching a second portion of the layer to form one or more openings within the semiconductor topography. Such a second portion is generally etched using a second set of etch parameters. In general, the first and second sets of etch parameters are based upon the statistical result of the pre-etch values for the semiconductor topography. Typically, the first set of etch parameters includes a first etch chemistry and a first etch time, while the second set of etch parameters includes a second etch chemistry and a second etch time. However, the first and second set of etch parameters are not restricted to etch chemistry and time, and may further include flow rate, magnetic field strength, temperature, and other appropriate processing variables.

In some cases, the first set of etch parameters is substantially equal to the second set of etch parameters. Such a case may represent a single etch process, in which the one or more openings are etched using a single etch chemistry for a particular amount of time.

In other cases, however, the first set of etch parameters is substantially different from the second set of etch parameters. Su ch a case may represent a double etch process, in which the one or more openings are etched using a first etch chemistry for a first amount of time, followed by a different (i.e., second) etch chemistry for a second amount of time. In such a double etch process, it is typically desired that the thickness of the first portion be substantially greater than the thickness of the second portion. In this manner, it may also be desired that the first portion be etched with a substantially different etch rate, or for a substantially different amount of time, than the etch rate and time used to etch the second portion.

Prior to the step of etching the first portion, the method may further include adjusting one or more parameters of the first and/or second set of etch parameters. The step of adjusting may be performed upon determining that the statistical result is substantially less than a target value. As stated above, the target value may be selected based on the dimensions of the particular semiconductor feature to be fabricated and the processing parameters used to fabricate such a feature. In some cases, the step of adjusting includes altering a ratio of the first etch chemistry to the second etch chemistry.

In other cases, however, the step of adjusting includes altering the first etch time and/or the second etch time. In yet other cases, the step of adjusting includes altering a ratio of the first etch chemistry to the second etch chemistry and altering the first etch time and/or the second etch time. In addition, or alternatively, the step of adjusting may include altering the composition of the first etch chemistry and/or the composition of the second etch chemistry.

In any case, the steps of etching the semiconductor topography of the aforementioned methods include forming the one or more openings to have top lateral widths that are substantially equal to respective bottom lateral widths of the one or more openings. In this manner, the methods provide a manner in which to fabricate openings having sidewall surfaces that exhibit substantially no tapering of lateral dimensions. In other words, the method fabricates openings having sidewall surfaces, which are substantially perpendicular (i.e., exhibit a 90° angle) to an upper surface of a region or layer underlying the etched layer. Alternatively, the method may fabricate openings having sidewall surfaces that are nearly perpendicular, such that a taper angle between the sidewall surfaces and an underlying layer deviates from 90° by substantially less than or equal to 3°. Preferably, the method provides a taper angle of approximately less than or equal to 1°.

In another embodiment, a system is provided herein for fabricating one or more openings in a semiconductor topography. Such a system may include a semiconductor processing tool, which is adapted to etch the semiconductor topography with adjustable etching parameters. The system also includes a measurement device, which is adapted to measure one or more dimensional features of the semiconductor topography, and a storage medium, which is adapted to store the measured values of the one or more dimensional features. The system further includes a central processing unit, which is adapted to process the measured values using program instructions stored within the storage medium. In this manner, the central processing unit is adapted to determine whether one or more of the adjustable etching parameters is adjusted prior to etching the semiconductor topography. After etching the central processing unit is preferably further adapted to refine an amount by which the one or more adjustable etching parameters are adjusted for subsequent semiconductor topographies.

BRIEF DESCRIPTION OF THE DRAWINGS

Other objects and advantages of the invention will become apparent upon reading the following detailed description and upon reference to the accompanying drawings in which.

Figure 1:
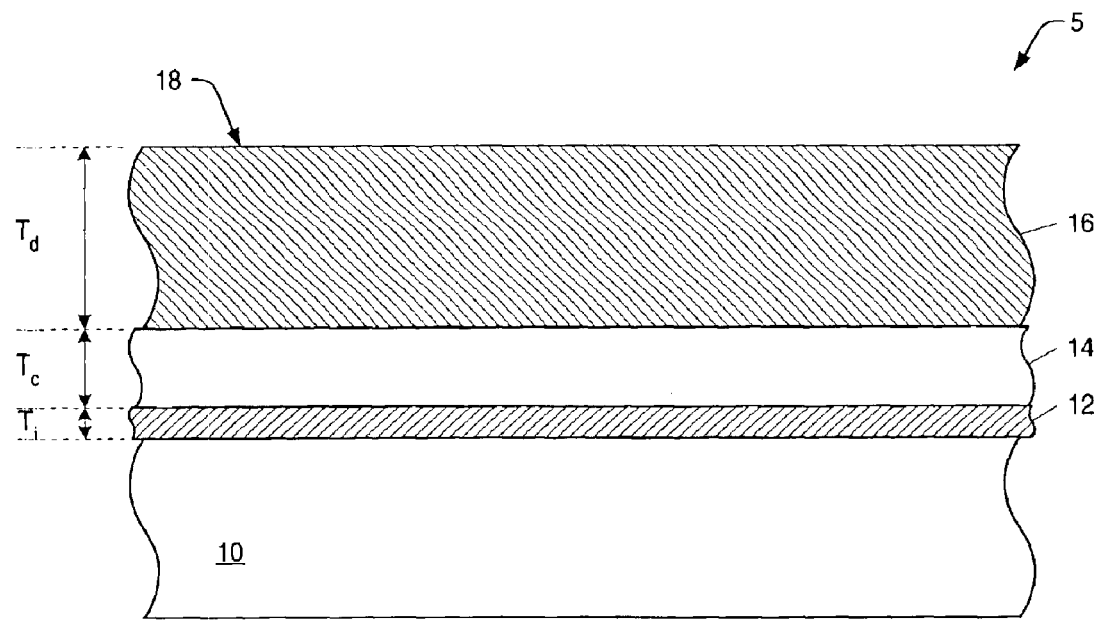
FIG. 1 depicts a partial cross-sectional view of a semiconductor topography in which one or more layers, including a dielectric layer and a conducting layer, are formed above a semiconductor substrate.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF PREFERRED EMBODIMENTS

There are several disadvantages to forming openings (such as, e.g., contact openings and vias) using a conventional single etch processes. For example, a conventional single etch process may use a selective etch chemistry that undesirably deposits a passivating material on the sidewall surfaces of the etched openings. In some cases, the passivating material may cause the amount of tapering in the sidewall surfaces of the etched, openings to steadily increase as the etch process continues. In this manner, the openings may be formed having bottom lateral widths that fall below an acceptable critical dimension, thereby interfacing with the operating characteristics of a subsequently formed contact structure.

Therefore, in some, embodiments, it may be desirable to form one or more openings using an etch process, which minimizes the use of a selective etch chemistry. Such an etch process may advantageously reduce the amount of tapering produced in the sidewall surfaces of the more etched openings. Preferably, such an etch process may be a double etch process, in which a first portion of the etched layer is removed with a non-selective etch chemistry, prior to removing a second portion of the etched layer with a selective etch chemistry. In general, the selectively of an etch chemistry may be described as the ratio of the etch rate of one material to the etch rate of another material. As such, the selectivity of an etch chemistry may vary significantly depending on the materials which are being etched. In particular, an etch chemistry that is non-selective to an underlying layer (i.e., a non-selective etch chemistry), may etch the underlying layer and the etched layer at substantially the same etch rate. Conversely, an etch chemistry that is selective to an underlying layer (i.e., a selective etch chemistry), may etch the underlying layer at a significantly slower ratio than the rate at which portions of the etched layer are removed by th selective etch chemistry.

In order to minimize the use of the second (i.e., selective) etch chemistry, the extent by which the first and second etch chemistries are used must be determined. Conventionally, a double etch process may etch one or more openings within a semiconductor topography using predefined processing conditions, such as predefined etch chemistries and predefined etch times. In a timed etch process, for example, a first portion of a layer within a semiconductor topography may be etched with a first etch chemistry for a predefined period of time (first etch time), while a second portion of the layer may be etched with a second etch chemistry for another predefined period of time (second etch time). In general, the etch time for a layer of material may be calculated for a multitude of semiconductor wafers based upon an expected variation in the thickness of an incoming layer and the etch rate of the etch chemistry within the reaction chamber. The thickness of an incoming layer, however, may vary significantly from wafer-to-wafer and/or from lot-to-lot. Thus, the etch times for the first and second etch processes may be set, such that a layer having a thickness on the upper end of a layer thickness specification may be adequately etched. In addition, the etch rate of an etch process may vary significantly depending on conditions within the reaction chamber. Thus, the etch times for the first and second etch processes may also be set, such that an etch chemistry having an etch rate on the slow side of an etch rate specification may be adequate to etch the layer.

As such, there are many disadvantages to etching the one or more openings using predefined processing conditions, such as a timed etch process. For example, a timed etch process may be stopped prematurely (i.e., before an underlying layer is exposed) when the thickness of a layer to be etched is substantially greater than a layer thickness specification. In another example, a timed etch process may over-etch the one or more openings (i.e., a portion of the underlying layer is undesirably removed) when the thickness of a layer to be etched is substantially less than a layer thickness specification. Another disadvantage is that the predefined processing conditions may be set to etch a multitude of semiconductor topographies according to a particular design specification. In such a case, such predefined processing conditions are not generally updated to reflect variations in dimensional features between semiconductor topographies on a wafer-to-wafer basis. Thus, predefined processing conditions may produce semiconductor devices having non-uniform operating characteristics, due to the variations in dimensional features not accounted for during fabrication of the devices.

In other conventional methods, a double etch process may etch the one or more openings using an optical endpoint detection process. For example, a first portion of a layer within a semiconductor topography may be etched with a timed etch process, while a second portion of the layer is etched using an endpoint detection process. As such, an endpoint of the etch process may be detected when a layer being etched has been substantially removed. Examples of techniques that are generally used for optical endpoint detection may include, laser interferometry, laser reflectivity, optical emission spectroscopy, and mass spectroscopy.

In one example, optical emission spectroscopy endpoint detection systems monitor the optical components of the plasma generated by the etch chemistry during an etch process. Some of the optical components, such as wavelength of light, are specific to the material being etched. Thus, by monitoring a wavelength of light, which is specific to the material being etched, the system can detect when one layer of the material has been removed to expose an underlying layer of the material. There are, however, several disadvantages to etching one or more openings using an endpoint detection system, such as an optical emission spectroscopy system. For example, the sensitivity of the system is generally determined by the etch rate and the total area being etched. Thus, an endpoint may be difficult to detect for slow etch processes. In addition, special test sites may be needed when small openings are being etched, or when the depths become comparable to the separation between semiconductor features (e.g., in high aspect ratio openings).

In another example, laser interferometry endpoint detection systems may be used to monitor the optical components of material being etched during an etch process. Some of the optical components, such as refractive index, are specific to the material being etched. Thus, by monitoring the amplitude of the intensity of reflected light from the etched material, the system can detect when one layer of the material has been removed to expose an underlying layer. For example, opaque/transparent interfaces (e.g., metal/dielectric interfaces) can be distinguished by a variation from a relatively constant amplitude to an oscillating amplitude of the intensity of reflected light. There are, however, several disadvantages to etching one or more openings using laser interferometry endpoint detection systems. For example, a rough surface topology generally reduces the amount of light that can be detected by the system. Therefore, the laser must be focused on a relatively flat region of the area being etched. However, if the area being etched is too small to obtain good reflectivity measurements (e.g., when etching contact openings in an $SiO_2$ layer), a larger test site (e.g., greater than about 0.5 mm) must be added to the wafer to facilitate such a measurement. In most cases, the test site must be located in a prime area of the wafer, thereby making such a test site rather expensive to manufacture. In addition, each wafer must be accurately aligned, such that the laser light is incident on the test area during the etch process. Such a step of alignment disadvantageously increases the processing time. Without such alignment, however, the output signal (i.e., the amount of light detected by the system) may be relatively weak and/or may be inaccurate.

Therefore, it may be desirable to provide a method for controlling the formation of one or more openings in a semiconductor topography. Preferably, such a method does not rely on predefined processing parameters, such as predefined etch times, or systems which adjust processing parameters during an etch process, such as endpoint detection systems. Instead, the method provided herein individually adjusts processing parameters for one or more semiconductor wafers before an etch process begins. More specifically, the method advantageously provides feedforward control of one or more processing parameters by individually adjusting the processing parameters for a given semiconductor wafer based upon pre-processing measurements of the given semiconductor wafer. In general, such pre-processing measurements may include measurements of one or more dimensional features within one or more semiconductor topographies on a wafer. As such, the method provided herein advantageously compensates for variations in the one or more dimensional features, which may vary between semiconductor topographies on a wafer, from wafer-to-wafer, or from lot-to-lot.

Figure 9:
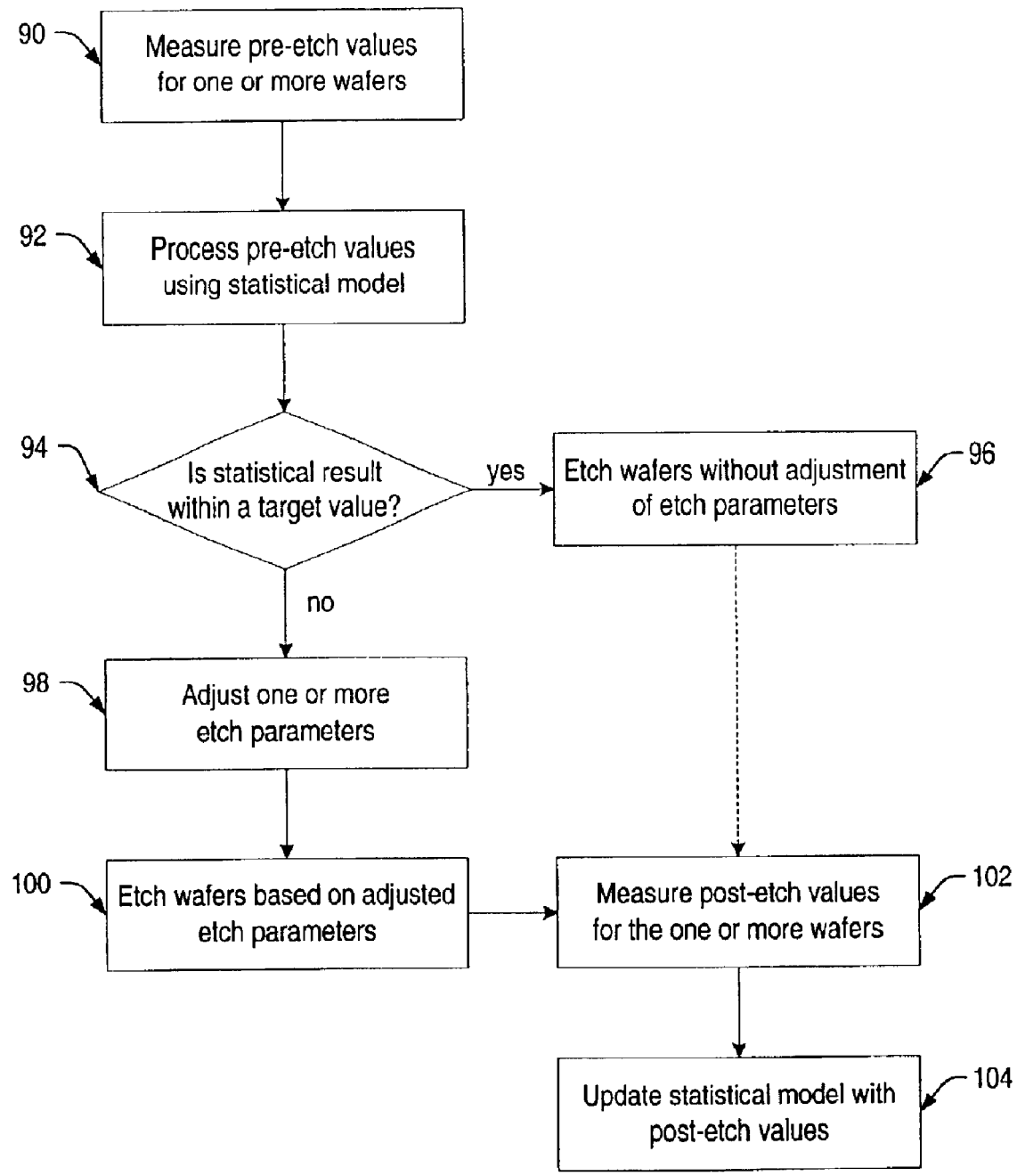
FIG. 9 is a flow chart diagram illustrating an exemplary method for fabricating one or more openings in a semiconductor topography.

Turning to the drawings, exemplary embodiments of a system and method for fabricating one or more openings in a semiconductor topography are shown. In some embodiments, a method for fabricating the one or more openings may be described in reference to FIG. 9. As such, the method illustrated in FIG. 9 includes measuring one or more pre-etch values of one or more semiconductor wafers (step 90). In other words, prior to etching the one or more wafers, the method includes measuring one or more dimensional features of a semiconductor topography to obtain pre-etch values of the one or more dimensional features. In some cases, the pre-etch values may include a thickness of a layer within the semiconductor topography (e.g., thickness, $T_d$, of dielectric layer 16, as described in more detail below in reference to FIG. 1). In other cases, the pre-etch values may include one or more widths of one or more gaps within a masking layer of the semiconductor topography (e.g., widths, $W_m$, of masking layer 20, as described in more detail below in reference to FIG. 2). In yet other cases, the pre-etch values may include both a thickness of a layer within the semiconductor topography and one or more widths of the gaps within a masking layer of the semiconductor topography. Alternatively, the pre-etch values may include measurements of any other dimensional feature of the semi conductor topography, which may influence the formation of openings in the semiconductor topography.

Subsequently, the method includes processing the one or more pre-etch values using a statistical model (step 92). Such a statistical model may be developed using Fuzzy Neural Network logic, in some cases. In this manner, the method includes determining a statistical result of the one or more pre-etch values. In some embodiments, such a statistical result may be a mean value, (x), of the measured pre-etch values. Generally, a mean value is a simple average of repeated attempts to measure the same quantity. Mathematically, a mean value is represented by:

$$\langle x \rangle = \frac{1}{N} \sum_{i=1}^{N} x_i, \quad \text{(Eq. 1)}$$

where $x_i$ are the individual pre-etch values and N is the total number of pre-etch values.

In some cases, the statistical result may be a mean value of the lateral widths of one or more gaps within a patterned masking layer (e.g., gaps 22 and 24 of masking layer 20, as described below in FIG. 2). In other cases, the statistical result may be a mean value of the layer thickness. Due to variations in fabrication processes, however, the lateral widths of one or more gaps and/or the thickness of a layer may vary significantly from wafer-to-wafer and/or from lot-to-lot, sometimes varying up to approximately 25%. Therefore, it may be desirable to calculate a standard deviation, a, of the pre-etch values to determine how far a subsequent pre-etch measurement is likely to be from the mean value. Mathematically, the standard deviation is represented by:

$$\sigma = \left[ \frac{1}{N-1} \sum_{i=1}^{N} (x_i - \langle x \rangle)^2 \right]^{\frac{1}{2}}. \qquad \text{(Eq. 2)}$$

In this manner, the method may include determining a statistical result of the pre-etch values, which may be expressed in terms of $\langle x \rangle \pm n\sigma$, where $n\sigma$ is an integer multiple of the standard deviation. For example, the statistical result may be expressed as a "3-sigma mean value," or a range of values encompassing the mean value plus or minus three standard deviations of the measured pre-etch values. In other embodiments, however, the statistical result may alternatively include a range of pre-etch values, a median pre-etch value, or any other appropriate statistical comparison of the measured pre-etch values.

In any embodiment, the step of processing the one or more pre-etch values (i.e., step 92) may further include comparing the incoming pre-etch values to a collection of pre-etch values of previously processed semiconductor topographies. In some cases, the collection of pre-etch values may be in the form of a historical database, as will be described in more detail below in reference to FIG. 8. In any case, the collection of pre-etch values may further include information relating pre-etch values to particular sets of etch parameters. For example, a semiconductor wafer having a mean dielectric layer thickness of approximately 6,000 Å may be etched with one set of etch parameters, while another semiconductor wafer having a mean dielectric layer thickness of approximately 10,000 Å may be etched with another set of etch parameters. Note, however, that such an example is only one example of the embodiment described herein. In some cases, the sets of etch parameters may be different due to the difference between the pre-etch values.

Subsequently, the method includes comparing the statistical result of the measured pre-etch values to a target value (step 94). Such a target value may be a design specification for one or more dimensional features of a particular semiconductor device. For example, a target value may include a desired thickness of a layer within the semiconductor topography and/or a desired width of the one or more gaps within a patterned masking layer of the semiconductor topography. Alternatively, instead of a desired value, the target value may include a small range of desired values, each of which may result in substantially uniform post-processing dimensional features.

In some cases, the statistical result of the pre-etch values may be within the target value (step 94). For example, the statistical result of the pre-etch values may be substantially greater than or equal to the target value. In such a case, the one or more wafers may be subsequently etched without adjustment of the etch process parameters (step 96). In general, etching without adjustment of etch parameters typically involves etching one or more semiconductor wafers, which demonstrate a mean pre-etch value, with a particular set of etch parameters that are substantially identical to the set of etch parameters used to etch a previously processed semiconductor wafer, which demonstrated substantially the same mean pre-etch value. For example, a semiconductor wafer may demonstrate a mean dielectric layer thickness substantially equal to a target value of 6,000 Å. In such an example, the semiconductor wafer may be etched with substantially the same set of etch parameters used to etch a previously processed semiconductor wafer, which also demonstrated a mean dielectric layer thickness of approximately 6,000 Å. Note, however, that such an example is only one example of the embodiment described herein. In this manner, the method includes etching one or more semiconductor wafers based upon a statistical result of the pre-etch values for the one or more semiconductor wafers.

In other cases, however, the statistical result of the pre-etch values may be substantially different than the target value (step 94). For example, the statistical result of the pre-etch values may be substantially less than the target value. In such a case, the method may include adjusting one or more etch process parameters (step 98) prior to etching the one or more semiconductor wafers. In general, the step of adjusting one or more etch process parameters includes adjusting the etch chemistry, adjusting the etch time, or adjusting the etch chemistry and the etch time, in some cases. In addition, the step of adjusting may further include adjusting other process parameters, such as flow rate (i.e., pressure within the etch chamber), magnetic field strength, temperature, or any other appropriate processing variable. In any case, the method described herein individually adjusts one or more etch process parameters for one or more semiconductor wafers based upon the statistical results of the one or more semiconductor wafers.

Subsequently, the method may include etching the one or more semiconductor wafers with the adjusted etch process parameters (step 100). As such, etching with adjusted etch parameters typically involves etching one or more semiconductor wafers, which demonstrate a mean pre-etch value substantially different than a target value, with a set of etch parameters that are substantially different from the set of etch parameters used to etch another semiconductor wafer, which demonstrated a mean pre-etch value within the target value. For example, a semiconductor wafer may demonstrate a mean dielectric layer thickness of approximately 5,000 Å. In some cases, such a mean dielectric layer thickness may be substantially less than a target value, such as a target value of approximately 6,000 Å. In such a case, the semiconductor wafer may be etched with a substantially different set of etch parameters used to etch a previously processed semiconductor wafer, which demonstrated a mean dielectric layer thickness substantially greater than or equal to 6,000 Å. Note, however, that such an example is only one example of the embodiment described herein.

In this manner, the method described thus far (i.e., the method described in steps 90–100 of FIG. 9) provides feed-forward control of etch process parameters on a wafer-by-wafer basis. Such feed-forward control advantageously adjusts etch process parameters to account for processing variations between semiconductor topographies on a single wafer, from wafer-to-wafer and from lot-to-lot. As such, the method described thus far may fabricate substantially uniform openings in one or more semiconductor wafers. In one example, the method described thus far may fabricate one or more openings having dimensions, which deviate substantially less than 5% from desired results.

After etching the one or more semiconductor wafers with the adjusted etch parameters, the method may further include measuring the results of etching the one or more semiconductor wafers (step 102). In other words, subsequent to etching the one or more wafers, the method may include measuring one or more dimensional features of one or more semiconductor topographies to obtain post-etch values (i.e., etch results) of the one or more dimensional features. For example, the method may include measuring a bottom lateral width of the one or more openings formed within the semiconductor topography to obtain post-etch values. In some cases, the one or more dimensional features measured to obtain pre-etch values may also be measured subsequent to the step of etching to obtain post-etch values. For example, a thickness of a layer within the semiconductor topography and one or more widths of the gaps within a masking layer of the semiconductor topography may be measured subsequent to the step of etching to obtain post-etch values. Alternatively, the method may not include step 102.

Next, the method may include updating the statistical model (step 104) with the measured post-etch values. In some cases, the method may include determining a statistical result of the post-etch values. In such a case, the method may include comparing the statistical result of the post-etch values to the statistical result of the pre-etch values. In addition, the method may include comparing the statistical result of the post-etch values to desired results of the etch process. For example, a mean result of the post-etch values may be compared with a desired bottom lateral width for an opening formed within a semiconductor topography. In some cases, the desired bottom lateral width may be a minimum critical dimension of the opening formed within a semiconductor topography.

In some cases, the statistical result of the post-etch values (i.e., etch results) may deviate substantially from the desired results. In such a case, the particular set of etch parameters used to etch a semiconductor wafer (i.e., having a particular statistical result of pre-etch values) may be changed to compensate for the difference between the etch results and the desired results. In this manner, the particular set of etch parameters may be updated for the next semiconductor wafer to be etched having the particular statistical result of pre-etch values. Therefore, the method described herein also provides feedback control of the etch parameters to continuously improve the statistical model. Such feedback control advantageously decreases the amount of variation between the etch results and the desired results for successive etch processes.

For example, a semiconductor wafer may demonstrate a mean dielectric layer thickness of approximately 5,000 Å, which is substantially less than a target value of 6,000 Å. In such a case, the semiconductor wafer may be etched with an adjusted set of etch parameters to form one or more openings in the semiconductor wafer. After etching, a mean value of the bottom lateral width of the one or more openings may deviate substantially from a desired bottom lateral width. Subsequently, the adjusted set of etch parameters may be updated to compensate for the difference between the etch results and the desired results. In this manner, the method may improve the etch process for a subsequent semiconductor wafer, which may also demonstrate a mean dielectric layer thickness of approximately 5,000 Å. Over time, the method preferably reduces the amount of variation between the etch results and the desired results from approximately a 5% variation to approximately a 0% variation.

In an alternative embodiment of the method described herein, the steps of measuring post-etch values (step 102) and updating the statistical model with the post-etch values (step 104) may be conducted after the step of etching the one or more wafers without adjustment of the etch parameters (step 96). For example, a semiconductor wafer, which demonstrates a mean dielectric layer thickness substantially equal to a target value of 6,000 Å, may be etched to form one or more openings without adjustment of the etch parameters, as described above. In some cases, the etch results (i.e., statistical result of the post-etch values) may deviate slightly from the desired results. In one example, the etch parameters (previously unadjusted in step 96) may now be adjusted slightly to compensate for the difference between the etch results and the desired results. In this manner, the method may further improve the etch process for a subsequent semiconductor wafer, which demonstrates a mean dielectric layer thickness substantially equal to the target value of approximately 6,000 Å. In another example, the target value may be adjusted slightly to compensate for the difference between the etch results and the desired results.

In other embodiments, a method for fabricating one or more openings in a semiconductor topography may be described in reference to FIGS. 1–5. FIG. 1 depicts semiconductor topography 5 in which one or more layers are formed upon and/or within semiconductor layer 10. Semiconductor layer 10 may preferably be a silicon substrate, and is generally doped either n-type (for producing a p-channel transistor) or p-type (for an n-channel transistor). More specifically, semiconductor layer 10 may be an epitaxial silicon layer grown on a monocrystalline silicon substrate, or an n-type or p-type well region formed in a monocrystalline silicon substrate. In addition, diffusion regions (not shown) may be formed within semiconductor layer 10. For example, diffusion regions may include lightly doped drain regions and heavily doped source/drain regions formed in the semiconductor layer. Furthermore, isolation regions (not shown) may be formed within semiconductor layer 10. For example, isolation regions may include a field oxide region, such as undoped silicon dioxide, which serves to isolate separate active regions on the semiconductor layer from one another. In addition, isolation regions may be formed by a number of techniques such as shallow trench isolation (STI), recessed oxide isolation (ROI), or local oxidation of silicon (LOCOS).

As shown in FIG. 1, conductive layer 14 may be formed above semiconductor layer 10. In some embodiments, insulating layer 12 may be interposed between semiconductor layer 10 and conductive layer 14. In some cases, insulating layer 12 may serve as a gate dielectric, a "pad" oxide, or an interlevel dielectric. In the case that insulating layer 12 serves as a gate dielectric, insulating layer 12 may be thermally grown silicon dioxide ($SiO_2$). Such a layer may be thermally grown by heating semiconductor layer 10 to a temperature of greater than about 700° C. in an oxidizing ambient such as $O_2$ or $H_2O$. Alternatively, insulating layer 12 may include deposited $SiO_2$. In addition, insulating layer 12 may be formed of other dielectrics, such as silicon nitride, silicon oxynitride, and nitrided silicon dioxide. Insulating layer 12 may also be formed from a high-permittivity ("high-k") dielectric. Appropriate materials for a high-k gate dielectric include, but are not limited to, tantalum pentoxide ($Ta_2O_5$), barium titanate ($BaTiO_3$), and titanium oxide ($TiO_2$). In any case, insulating layer 12 is generally formed having a thickness, $T_i$, which is generally dependent on whether insulating layer 12 serves as a gate dielectric, a "pad" oxide, an interlevel dielectric, or any other insulating feature. In the case insulating layer 12 serves as a gate dielectric, a thickness, $T_i$, of insulating layer 12 may be approximately 15 Å to approximately 200 Å. Thickness of insulating layer 12 may also be larger or smaller depending on the semiconductor device being formed. In other embodiments, insulating layer 12 may not be included within semiconductor topography 10. In some cases, conductive layer 14 may be adapted to couple with another conductive structure or layer, such that an electrical connection is made between the conductive layers.

Conductive layer 14 may represent any one of a plurality of conductive structures including, for example, a local interconnect layer or one or more gate structures formed upon and laterally spaced across semiconductor layer 10. As such, appropriate materials for conductive layer 14 may include, but are not limited to, doped polysilicon or any metal material, such as aluminum, cobalt, copper, iron, nickel, nickel-iron-chromium, platinum, tantalum, titanium, tungsten, or a metal alloy thereof. Conductive layer 14 may be deposited using physical vapor deposition (PVD) or a chemical vapor deposition (CVD) process. Alternatively, conductive layer 14 may be deposited using techniques such as atmospheric pressure chemical vapor deposition (APCVD), low-pressure chemical vapor deposition (LPCVD), plasma-enhanced chemical vapor deposition (PECVD), and conventional sputtering. In any case, conductive layer 14 is generally formed having a thickness, $T_c$, which is dependent on whether conducting layer 14 serves as a local interconnect layer, a gate structure, or any other conductive feature. For example, conductive layer 14 may be formed having a thickness, $T_c$, between about 400 Å to about 10,000 Å.

To form a gate structure, for example, a layer of conductive material 14 such as polysilicon, aluminum, copper, or tungsten may be deposited upon insulating layer 12. In some cases, for example, polysilicon may be deposited using chemical vapor deposition (CVD) of silicon from a silane source. In such a case, polysilicon may be deposited having a thickness, $T_c$, of approximately 400 Å to approximately 5,000 Å. In other cases, a gate structure may be formed such that conductive layer 14 includes multiple layers of material such as a conventionally doped polysilicon and a silicide. In any case, the thickness of conducting layer 14 may be larger or smaller depending on the semiconductor device being formed.

As shown in FIG. 1, a dielectric layer may be formed upon conducting layer 14 and subsequently planarized to form dielectric layer 16. Dielectric layer 16 may include a premetal dielectric layer or an interlevel dielectric layer. For example, dielectric layer 16 may include silicon dioxide ($SiO_2$), tetraorthosilicate glass (TEOS), silicon nitride ($Si_xN_y$), silicon oxynitride ($SiO_xN_y(H_2)$), or silicon dioxide/silicon nitride/silicon dioxide (ONO). In addition, dielectric layer 16 may be silicon dioxide deposited by a CVD process, which may be nitrided in a subsequent processing step. Silicon nitride and silicon oxynitride may be formed by a CVD process using a silicon source, such as silane, chlorosilane ($SiH_xCl_y$), or dichlorosilane ($SiCl_2H_2$), and a nitrogen source, such as nitrogen ($N_2$), nitrous oxide ($N_2O$), and ammonia ($NH_3$). Other techniques that may be used to deposit silicon dioxide may include PECVD using a silane source, atmospheric-pressure CVD (APCVD), and low-pressure CVD (LPCVD) using silane or TEOS sources. In addition, dielectric layer 16 may be formed from a low-permittivity ("low-k") dielectric, generally known in the art as a dielectric having a dielectric constant (k) of less than about 3.5. One low-k dielectric currently in use, which is believed to make a conformal film, is fluorine-doped silicon dioxide.

Dielectric layer 16 may also be formed from, e.g., low-doped borophosphosilicate glass (BPSG), low-doped phosphosilicate glass (PSG), or undoped silicon dioxide. In some cases, dielectric layer 16 may be deposited by a high density plasma (HDP) deposition technique. A high density plasma may include a charge density that generally exceeds that used in conventional plasma enhanced and plasma assisted chemical vapor deposition (PECVD and PACVD). For example, a high density plasma may include a charge density that exceeds that which may be used to deposit conventional PECVD BPSG layers such as charge densities which may generally exceed approximately $10^7$ charged particles per $cm^3$.

Following deposition, dielectric layer 16 may be planarized to a level spaced above conductive layer 14 to provide a substantially planar upper surface 18 of dielectric layer 16, as shown in FIG. 1. For example, dielectric layer 16 may be planarized using a technique, such as a spin on glass (SOG) process or an etchback technique, such as CVD/bias-sputter etchback or sacrificial layer etchback. However, it may be desired to utilize a global planarization technique, such as chemical mechanical polishing (CMP), in submicron semiconductor technologies employing multi-level interconnect systems. Subsequent to planarization, dielectric layer 16 may be formed having a thickness, $T_d$, which may also be dependent on the type of structure formed from conductive layer 14. For example, in the case that conductive layer 14 includes one or more gate structures, an appropriate thickness of dielectric layer 16 may be approximately 3,000 Å to approximately 15,000 Å, or more preferably between approximately 6000 Å to approximately 12,000 Å. Larger or smaller thicknesses of dielectric layer 16, however, may be appropriate depending on the design specification of the device being formed.

More specifically, the deposition thickness of the dielectric layer (i.e., the dielectric layer thickness before planarization) is generally dependent on the step height of the structure formed from conductive layer 14, as well as the level of controllability and uniformity of the planarization process. As an example, suppose that the step height of a gate structure formed from conductive layer 14 is about 3000 Å and the target thickness for dielectric layer 16 after planarization is about 5000 Å (i.e., about 2000 Å above the gate structure). In such an example, it may be beneficial to deposit the dielectric material having a thickness of about 8000 Å or more to compensate for CMP controllability and uniformity issues.

Figure 2:
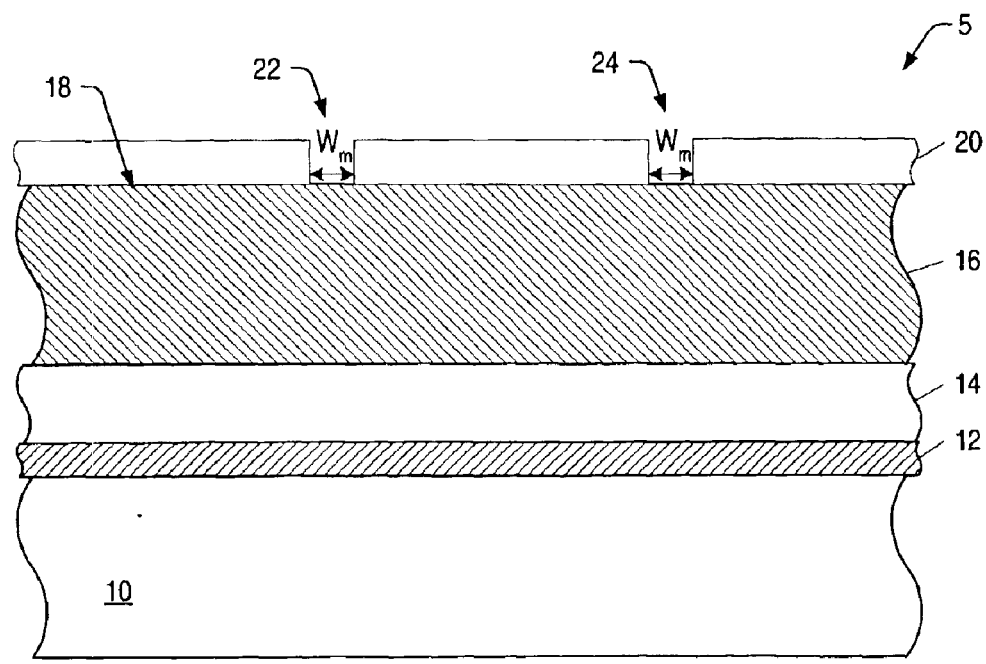
FIG. 2 depicts a partial cross-sectional view of a semiconductor topography in which a patterned masking layer is formed upon the dielectric layer of FIG. 1.

As shown in FIG. 2, masking layer 20 may be formed upon dielectric layer 16 and may include a hard mask layer, a photoresist layer, or a combination of both. In some cases, a hard mask layer of undoped silicon dioxide may be used if dielectric layer 16 is a lightly doped or heavily doped dielectric material. In this manner, the hard mask layer may prevent outdiffusion from dielectric layer 16 during subsequent thermal processes and/or may prevent moisture from migrating into dielectric layer 16. In such a case, a layer of photoresist may be deposited upon the hard mask layer and patterned using a lithography technique. In particular, the patterned photoresist layer may be used as an etch mask such that exposed portions of the hard mask layer are removed during an etch process to form masking layer 20. Alternatively, masking layer 20 may only include the photoresist layer.

As illustrated in FIG. 2, open regions within masking layer 20 form gaps 22 and 24, which expose portions of upper surface 18 of dielectric layer 16. Although only two gaps are illustrated, any number of gaps may be formed upon and laterally spaced across dielectric layer 16. In addition, gaps 22 and 24 may be formed having substantially identical lateral widths, $W_m$, when measured between the sidewall surfaces of gaps 22 and 24 along the exposed upper surface of dielectric layer 16. Alternatively, gaps 22 and 24 may be formed having substantially different lateral widths, due to variations in the fabrication process and/or variations in design specifications.

In this manner, the method includes measuring one or more dimensional features of semiconductor topography 5 to obtain pre-etch values of one or more dimensional features, as illustrated in FIGS. 1 and 2. In some cases, the pre-etch values may include a thickness, such as thickness, $T_d$, of dielectric layer 16 (i.e., as shown in FIG. 1). In other cases, the pre-etch values may include one or more widths, such as a width, $W_m$, of one or more gaps within masking layer 20 (i.e., as shown in FIG. 2). In yet other cases, the pre-etch values may include both a thickness of dielectric layer 16 and one or more widths of the gaps within masking layer 20. Alternatively, the pre-etch values may include measurements of any other dimensional feature of semiconductor topography 5, which may influence the formation of openings in the semiconductor topography. Subsequently, the method includes determining a statistical result of the pre-etch values. As stated above, such a statistical result may include a mean pre-etch value, a range of pre-etch values, a median pre-etch value, or any other appropriate statistical comparison of the measured pre-etch values.

After determining a statistical result of the pre-etch values, the method includes forming one or more openings in regions of dielectric layer 16, which are not protected by masking layer 20 (e.g., regions of dielectric layer 16 in vertical alignment with gaps 22 and 24 of masking layer 20). Such a process is described in more detail below in reference to FIGS. 3 and 4. Similar to the generic embodiment described above (i.e., in reference to FIG. 9), the current embodiment includes etching a layer of the semiconductor topography using a set of etch parameters that are based upon the statistical result of the measured pre-etch values. In addition to the generic embodiment described above, however, the current embodiment further includes etching a first portion of a layer within the semiconductor topography using a first set of etch parameters. Subsequently, the current embodiment includes etching a second portion of the layer to form one or more openings within the semiconductor topography using a second set of etch parameters. However, a single etch process may alternatively be used in some embodiments.

In some cases, the first set of etch parameters may include a first etch chemistry and a first etch time, whereas the second set of etch parameters may include a second etch chemistry and a second etch time. In some cases, the first set and second set of etch parameters may include additional parameters, such as flow rate (i.e., pressure), magnetic field strength, temperature, or other processing variables that may influence the formation of the one or more openings. In any case, the first set of etch parameters may be substantially equal to the second set of etch parameters, in some embodiments. Such an embodiment may be similar to a single etch process in which one etch chemistry is used to etch the semiconductor topography for a given amount of time (i.e., one etch time). However, as stated above, such a single etch process may require additional processing steps, such as the step of forming an etch stop layer within the semiconductor topography. In addition, such a single etch process may require the use of a selective etch chemistry for the duration of the etch process. As stated above, such a selective etch chemistry may undesirably cause significant tapering in the sidewall surfaces of the one or more openings.

Therefore, it may be desirable that the first set of etch parameters are substantially different from the second set of etch parameters, in other embodiments. Such an embodiment may be described as a double etch process in which two substantially different etch chemistries are used to etch the semiconductor topography. Depending on the respective etch rates of the first and second etch chemistries, the first and second etch times may be substantially the same or may be substantially different from each other.

Figure 3:
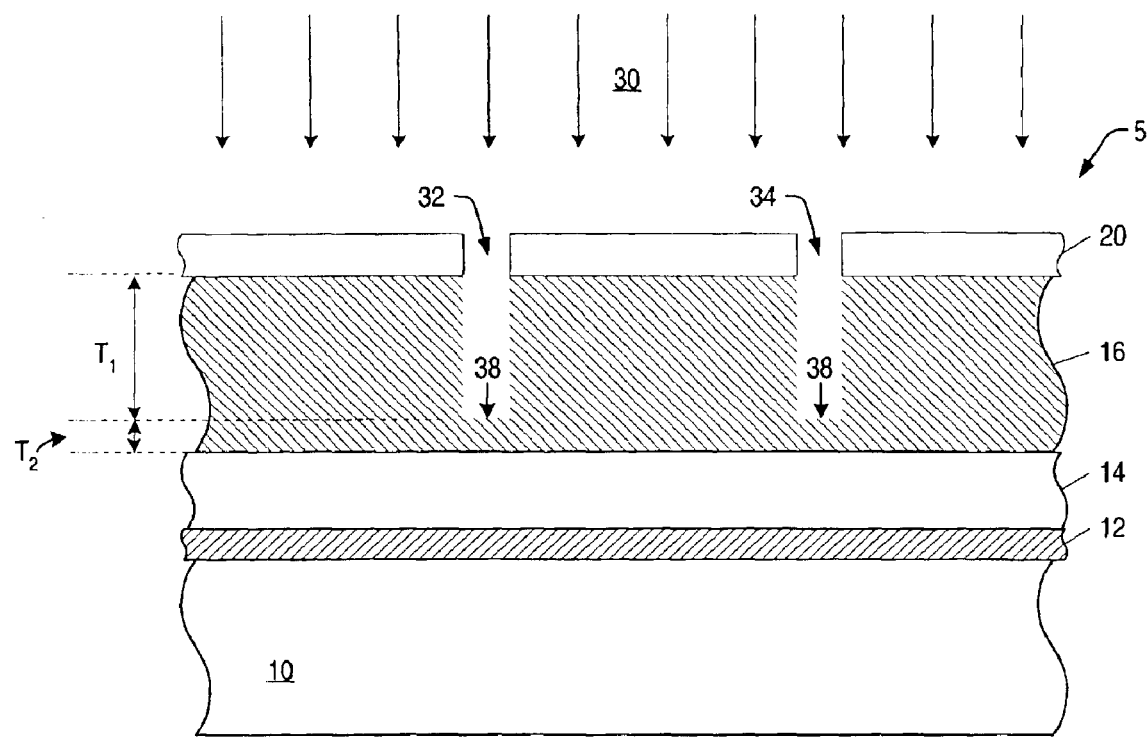
FIG. 3 depicts a partial cross-sectional view of a semiconductor topography in which a first portion of exposed portions of the dielectric layer are removed with a first set of etch parameters.
Figure 4:
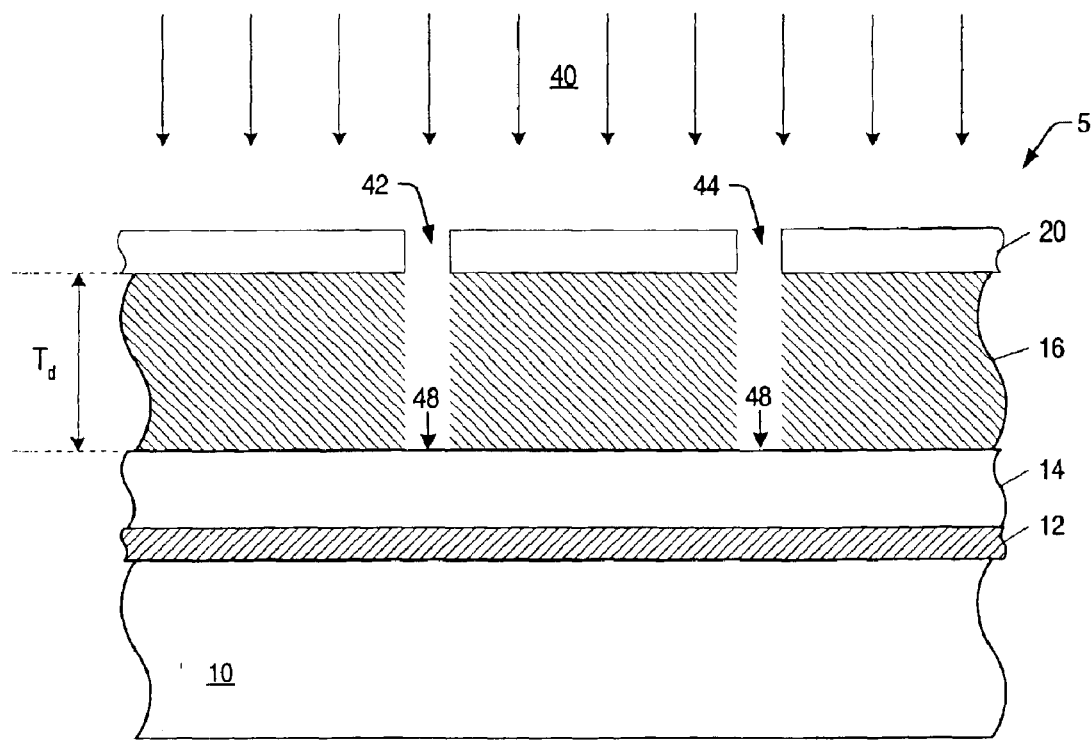
FIG. 4 depicts a partial cross-sectional view of a semiconductor topography in which a second portion of exposed portions of the dielectric layer are removed with a second set of etch parameters to form one or more openings in the semiconductor topography.

As stated above, FIGS. 3 and 4 illustrate exemplary etch processes according to the method described herein. In particular, FIG. 3 illustrates the formation of openings 32 and 34 within dielectric layer 16 in regions of the dielectric layer that are not protected by patterned masking layer 20. Openings 32 and 34 may be formed by etching a first portion of dielectric layer 16 with a first etch chemistry 30, such that surfaces 38 of openings 32 and 34 are formed. As illustrated in FIG. 3, such a first portion may have a thickness, such as thickness $T_1$. In most cases, first etch chemistry 30 may be substantially free of hydrogen. For example, first etch chemistry 30 may include $O_2$ and/or CO, as well as one or more fluorocarbons such as and $C_xF_y$, in which $x \geq 1$ and $y \geq 2$. In addition, first etch chemistry 30 may further include an inert gas such as argon (Ar), nitrogen ($N_2$), or xenon (Xe). In some cases, the inclusion of one or more gases may improve the anisotropy (i.e., etching substantially confined to a particular direction) of the first etch chemistry. In other cases, first etch chemistry 30 may also include a number of fluorinated carbon compounds and/or chlorinated carbon compounds such as $CFCl_3$, $CF_2Cl_2$, $CF_3Cl$, $CF_4$, $C_2F_6$, and $C_2ClF_5$.

In any case, it may be desirable that first etch chemistry 30 be substantially non-selective to the material composition of conductive layer 14. As such, first etch chemistry 30 may etch the material compositions of dielectric layer 16 and conductive layer 14 at substantially the same etch rate. As stated above, the selectivity of an etch chemistry may be generally defined as the ratio of the etch rates of different materials. For example, first etch chemistry 30 may have a dielectric:conductive material etch selectivity of approximately 1:1 to approximately 2:1. In other words, first etch chemistry 30 may etch the material composition of dielectric layer 16 substantially twice as fast as it would etch the material composition of conductive layer 14, in the case that first etch chemistry 30 has a dielectric:conductive material etch selectivity of approximately 2:1.

In addition, FIG. 4 illustrates the formation of openings 42 and 44 within dielectric layer 16 in regions of the dielectric layer, which are not protected by patterned masking layer 20. Openings 42 and 44 may be formed by etching a second portion of dielectric layer 16 with second etch chemistry 40, such that upper surface 48 of conductive layer 14 may be exposed. As shown in FIG. 3, a second portion of dielectric layer 16 may extend from surfaces 38 of dielectric layer 16 to upper surface 48 of conductive layer 14. In this manner, the second portion of dielectric layer 16 may have a thickness, $T_2$. In some cases, second etch chemistry 40 may include at least one hydrogen-containing compound. For example, second etch chemistry 40 may include oxygen ($O_2$) and one or more hydrofluorocarbons, such as $C_xH_yF_z$ where $x \geq 1$, $y \geq 1$, and $z \geq 2$. In addition, second etch chemistry 40 may further include an inert gas, such as argon (Ar), nitrogen ($N_2$), or xenon (Xe), to improve the anisotropy of the second etch chemistry. Alternatively, second etch chemistry 40 may include a number of fluorinated carbon compounds and/or chlorinated carbon compounds, such as $CFCl_3$, $CF_2Cl_2$, $CF_3C_1$, $CF_4$, $C_2F_6$, and $C_2ClF_5$.

In any case, it may be desirable that second etch chemistry 40 be substantially selective to the material composition of conductive layer 14. As such, second etch chemistry 40 may etch the material composition of dielectric layer 16 at a relatively fast etch rate, compared to the relatively slow etch rate in which second etch chemistry 40 may etch the material composition of conductive layer 14. For example, second etch chemistry 40 may have a dielectric:conductive material etch selectivity of approximately 5:1 to approximately 30:1. In this manner, second etch chemistry 40 may etch the second portion of dielectric layer 16 at a substantially faster etch rate than the etch rate at which first etch chemistry 30 etched the first portion of the dielectric layer. As such, second etch chemistry 40 may etch a thickness, $T_2$, of dielectric layer 16 that is substantially smaller than a thickness, $T_1$, of dielectric layer 16, which was etched with first etch chemistry 30. In this manner, a substantially smaller portion of dielectric layer 16 may be etched with a selective etch chemistry, such as second etch chemistry 40. Such a minimization of the second etch process may advantageously reduce the amount of tapering produced in the sidewall surfaces of the one or more openings.

Though an etch process using a non-selective etch chemistry (e.g., first etch chemistry 30) followed by a selective etch chemistry (e.g., second etch chemistry 40) may reduce the amount of tapering produced in the sidewall surfaces of the one or more openings, the etch process may not perform consistently for all wafers in one or more lots of wafers. For example, variations in the fabrication process may cause a dielectric layer thickness, $T_d$, to vary significantly from wafer-to-wafer and/or from lot-to-lot. In some cases, a dielectric layer thickness may vary up to about 25%. In another example, variations in the fabrication process may cause the lateral widths, $W_m$, of the gaps within a patterned masking layer to vary significantly from wafer-to-wafer and/or from lot-to-lot. In some cases, such lateral widths may also vary up to about 25%. Therefore, prior to etching the one or more wafers, the method includes comparing a statistical result of one or more pre-etch values to a target value, as described above in reference to FIG. 9.

In some cases, the statistical result of the pre-etch values may be within a target value. For example, the statistical result of the pre-etch values may be substantially greater than or equal to the target value. In such a case, the one or more wafers may be etched without adjustment of the first and second etch parameters. As stated above, etching without adjustment of etch parameters typically includes etching one or more semiconductor wafers, which demonstrate a mean pre-etch value, with a first and second set of etch parameters that are substantially identical to the first and second set of etch parameters used to etch a previously processed semiconductor wafer, which demonstrated the same mean pre-etch value.

For example, etching without adjustment of etch parameters may include etching a first portion of dielectric layer 16 with first etch chemistry 30 including $C_4F_8$ and CO. In such an example, a flow rate of $C_4F_8$ may be approximately 10 sccm to approximately 100 sccm, and more preferably may be approximately 10 sccm to approximately 40 sccm. In addition, a flow rate of CO may be approximately 10 sccm to approximately 100 sccm, and more preferably may be approximately 25 sccm to approximately 55 sccm. In some cases, an inert gas, argon (Ar), xenon (Xe), or nitrogen ($N_2$), may also be added to the gas flow of first etch chemistry 30. For example, a flow rate for argon may be approximately 50 sccm to approximately 1000 sccm. Furthermore, etching the first portion of dielectric layer 16 with first etch chemistry 30 may be conducted for a period of time (i.e., a first etch time), which is individually determined based upon the statistical results of the pre-etch values for the current semiconductor wafer before the first etch process begins. For example, the first portion may be etched for a first etch time, which is calculated to be approximately one minute to approximately two minutes, and more preferably approximately one and a half minutes.

Subsequently, a second portion of dielectric layer 16 may be etched such that second etch chemistry 40 includes $C_2H_2F_4$ and $CHF_3$, in one example. In such an example, a flow rate of $C_2H_2F_4$ may be approximately 1 sccm to approximately 20 sccm, and more preferably may be approximately 2 sccm to approximately 15 sccm. In addition, a flow rate of $CHF_3$ may be approximately 5 sccm to approximately 200 sccm, and more preferably may be approximately 50 sccm to approximately 100 sccm. In some cases, an inert gas, such as argon (Ar), xenon (Xe), or nitrogen ($N_2$), may also be added to the gas flow of second etch chemistry 40. For example, a flow rate for argon may be approximately 50 sccm to approximately 1000 sccm. Furthermore, etching the second portion of dielectric layer 16 with second etch chemistry 40 may be conducted for a period of time (i.e., a second etch time), which is also individually determined based upon statistical results of the pre-etch values for the current semiconductor wafer before the first etch process begins. For example, the second portion may be etched for a second etch time, which is calculated to be approximately one half minute to approximately two minutes, and more preferably approximately one minute.

In other cases, however, the statistical result of the pre-etch values may be substantially different than a target value. For example, the statistical result of the pre-etch values may be substantially less than the target value. In such a case, the method may include adjusting one or more parameters of the first and second set of etch parameters prior to etching the semiconductor topography. In some cases, the step of adjusting includes altering a ratio of the first etch chemistry to the second etch chemistry. Referring to the above examples, altering a ratio of first etch chemistry 30 to second etch chemistry 40 may include altering a ratio of $[C_4F_8/CO]$ to $[C_2H_2F_4/CHF_3]$. For example, altering a ratio of the first etch chemistry to the second etch chemistry may include increasing the flow rate of $[C_4F_8/CO]$ relative to the flow rate of $[C_2H_2F_4/CHF_3]$. Alternatively, the step of adjusting may include altering a composition of first etch chemistry 30 and/or a composition of second etch chemistry 40. In this manner, first etch chemistry 30 may be changed from $C_4F_8/CO$ to another fluorocarbon compound, such as $C_4F_8/O_2$, $C_4F_8/CO/O_2$, $C_5F_8/CO$, or $C_5F_8/O_2$, in some cases. In addition, second etch chemistry 40 may be changed from $C_2H_2F_4/CHF_3$ to another hydroflourocarbon compound, such as $CH_2F_2$, $C_2H_2F_5$, or $CH_3F$, in some cases.

In other cases, the step of adjusting includes altering the first etch time and the second etch time. As such, altering the first and second etch times may include adding (or subtracting) an amount of time to (or from) the first etch time and subtracting (or adding) the same amount to time from (or to) the second etch time. Referring to the above examples, altering the first etch time may include adding an amount of time, e.g., approximately one half minute, to change the first etch time from approximately one and a half minutes to approximately two minutes. Similarly, altering the second etch time may include subtracting the same amount of time, e.g., approximately one half minute, to change the second etch time from approximately one minute to approximately one half minute.

In yet other cases, the step of adjusting may include altering the first and second etch chemistries and altering the first and second etch times. In addition, or alternatively, the step of adjusting may include altering other etch process parameters, such as flow rate (i.e., pressure within the etch chamber), magnetic field strength, temperature, or other processing variables that may influence the formation of the one or more openings. In second etch chemistry 40, for example, the anisotropy of the second etch chemistry may be increased by adjusting the flow rate of $C_2H_2F_4$ from approximately 10 sccm to approximately 20 sccm. In such an example, the anisotropy of the second etch chemistry is increased by adding substantially more sidewall passivation and/or polymer forming agents to the gas mixture. In any case, the step of adjusting the one or more etch parameters is conducted prior to etching dielectric layer 16 to form one or more openings within a semiconductor topography. In this manner, the method described herein individually adjusts one or more etch process parameters for a semiconductor topography based upon the statistical results of the semiconductor topography.

Figure 5:
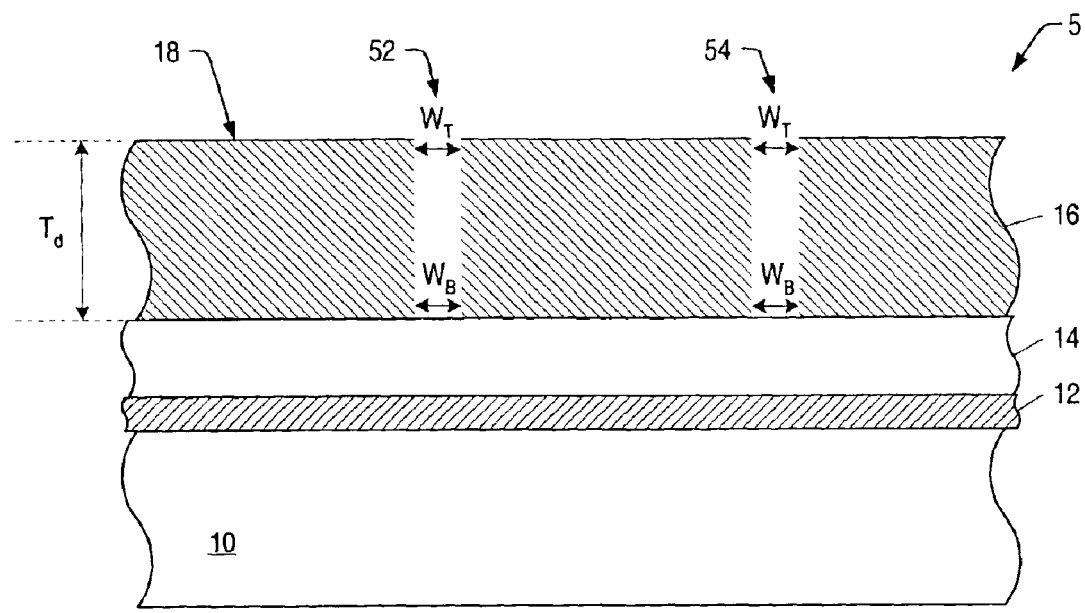
FIG. 5 depicts a partial cross-sectional view of a semiconductor topography in which the patterned masking layer is removed.

FIG. 5 illustrates an exemplary result of etching semiconductor topography 5 according to the method described herein. In general, FIG. 5 illustrates one or more openings, such as openings 52 and 54, formed within dielectric layer 16 of semiconductor topography 5. As will be described in more detail below, FIG. 5 illustrates openings 52 and 54 after removal of masking layer 20 and after "cleaning" of openings 52 and 54. In particular, FIG. 5 depicts openings 52 and 54 as having top lateral widths, $W_T$, which are substantially equal to their respective bottom lateral widths, $W_B$. In some cases, the method may fabricate the one or more openings to have sidewall surfaces that are substantially perpendicular to an upper surface of an underlying conductive layer, such as conductive layer 14. In other cases, however, the method may fabricate the one or more openings to have sidewall surfaces that are nearly perpendicular to an upper surface of conductive layer 14. For example, the method may provide a taper angle between the sidewall surfaces of the one or more openings and an upper surface of conductive layer 14 that deviates from 90° by substantially less than or equal to 3°. Preferably, the method provides a taper angle of approximately less than or equal to 1°.

In addition, FIG. 5 depicts openings 52 and 54 as having a high aspect ratio of approximately greater than or equal to about 4:1. For example, FIG. 5 depicts openings 52 and 54 as having a height ($T_d$) approximately four times greater than a width ($W_B$) of openings 52 and 54. The method described herein, however, may fabricate one or more openings having aspect ratios substantially greater than or substantially less than about 4:1. Preferably, the method may be useful in fabricating openings having significantly higher aspect ratios than can be easily fabricated using conventional methods. For example, the method may fabricate openings having aspect ratios substantially greater than 5:1. In some cases, the method may fabricate openings having a height within a range of about 3,000 Å to about 15,000 Å. Preferably, the height of the openings may fall within a range of about 6000 Å to about 12,000 Å. In such a case, the openings may include a bottom lateral width of about 600 Å to about 3,000 Å, or more preferably between approximately 1,200 Å to approximately 2,400 Å.

Thus, the method described herein provides a means to fabricate one or more high aspect ratio openings having substantially perpendicular sidewall surfaces and acceptable critical dimensions. As stated above, critical dimensions may represent the smallest dimension that may be formed on a semiconductor topography using various fabrication techniques, such as photolithography and etching techniques. However, due to the effects of subsequent processing steps, such as etching a second portion of a dielectric layer with a selective etch chemistry, a semiconductor feature may be reduced below such a critical dimension when using a conventional etch processes. Therefore, by providing feed forward control of etch process parameters, the method described herein maintains acceptable critical dimensions of openings independent of structural variations within semiconductor topographies from wafer-to-wafer and from lot-to-lot. As stated above, an acceptable critical dimension may be described as the smallest dimension of a semiconductor feature that maintains optimal operating characteristics of that feature.

Figure 6:
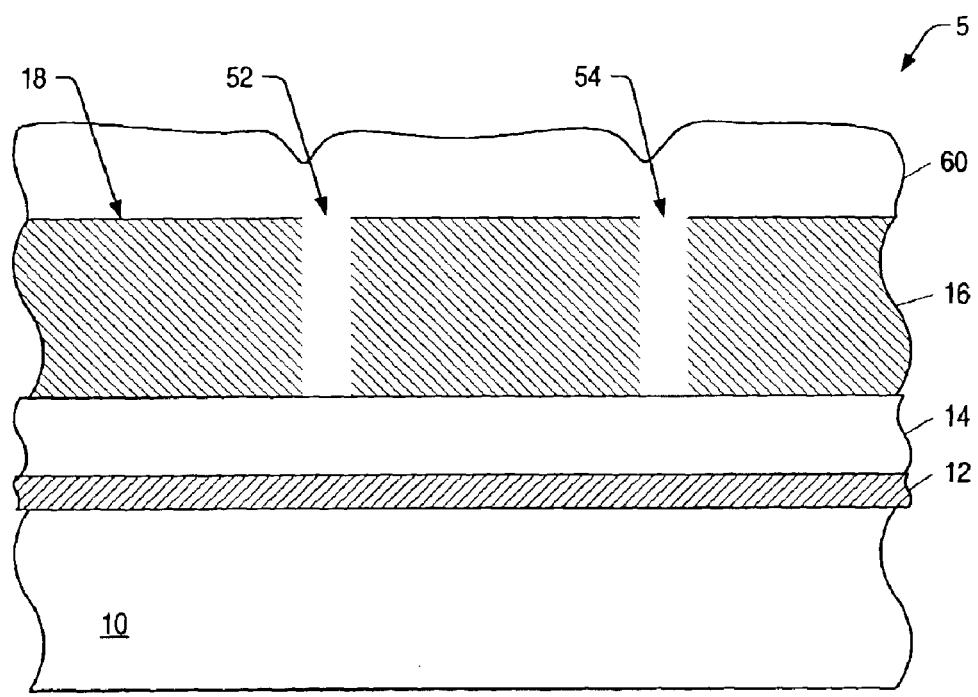
FIG. 6 depicts a partial cross-sectional view of a semiconductor topography in which a layer of conductive material is deposited upon the semiconductor topography of FIG. 5.
Figure 7:
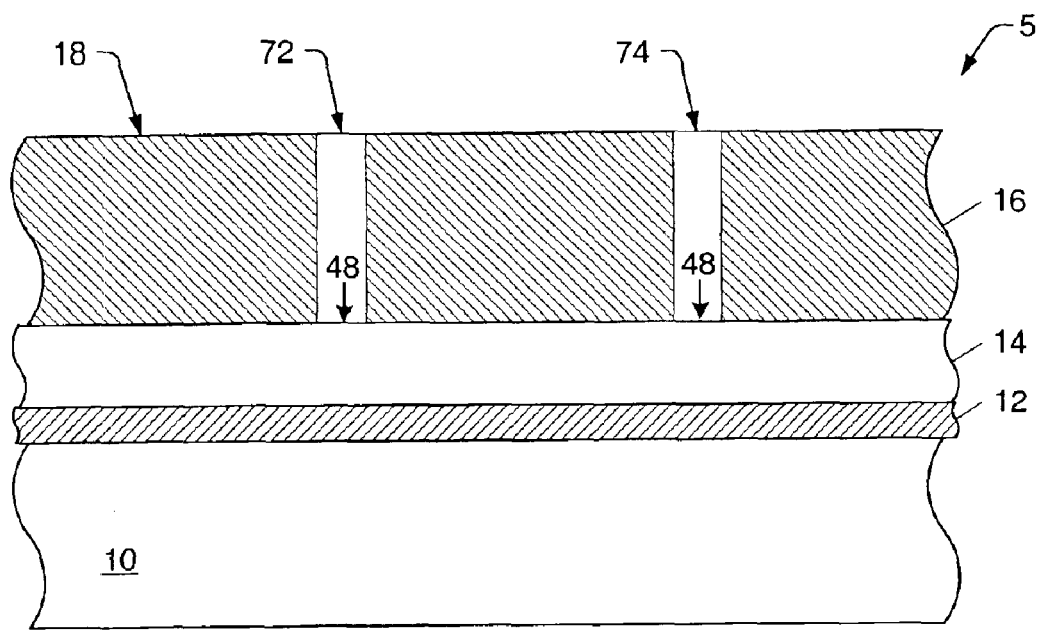
FIG. 7 depicts a partial cross-sectional view of a semiconductor topography in which the layer of conductive material is planarized to form one or more contact structures in the semiconductor topography.

In addition, FIGS. 5–7 illustrate further processing steps to form contact structures within the one or more openings in semiconductor topography 5. Once the one or more openings, such as openings 52 and 54, are formed by etching the first and second portions of dielectric layer 16, patterned masking layer 20 may be removed by a wet etch or plasma etch process. In addition, the one or more openings may be cleaned with a sputter etch process, such as a radio frequency (RF) sputter etch, before conductive material is formed within the one or more openings, as described below in reference to FIG. 6. As stated above, it is often difficult, if not impossible to clean high aspect ratio openings using conventional methods, such as an RF sputter etch process, if the sidewall surfaces of the openings are significantly tapered. The method described herein, however, fabricates openings having substantially perpendicular sidewall surfaces independent of variations in the dimensional features of a semiconductor topography. Therefore, by providing feed forward control of the etch parameters on a wafer-by-wafer basis, the method fabricates openings that are substantially easier to clean. In this manner, any residual material remaining on upper surface 48 of conductive layer 14 may be removed to ensure electrical contact between conductive layer 14 and a contact structure subsequently formed within the one or more openings.

FIG. 6 illustrates formation of conductive material layer 60 within openings 52 and 54 and upon upper surface 18 of dielectric layer 16. Conductive material layer 60 may be formed by depositing a conductive material such as aluminum, tungsten, titanium, or appropriate alloys thereof into openings 52 and 54. For example, a CVD process may be used to deposit aluminum by the pyrolysis of triisobutyl aluminum (TIBA) in a reactor chamber maintained at a temperature of approximately 250° C. and a pressure less than approximately 1 torr. In addition, conductive material layer 60 may be deposited using a technique such as atmospheric pressure chemical vapor deposition (APCVD), low pressure chemical vapor deposition (LPCVD), plasma-enhanced chemical vapor deposition (PECVD), conventional sputtering, and physical vapor deposition (PVD). In most cases, conductive material layer 60 may be formed having a thickness sufficient to fill openings 52 and 54.

FIG. 7 illustrates contact structures 72 and 74 formed through dielectric layer 16 and in contact with upper surface 48 of conductive layer 14. A selective etch-back process may be used to remove conductive material layer 60 from upper surface 18 of dielectric layer 16. Alternatively or in addition, a chemical-mechanical polishing (CMP) process may be used to remove conductive material layer 60 from upper surface 18 of dielectric layer 16. In this manner, an upper surface of conductive material layer 60 may be substantially coplanar with upper surface 18 of dielectric layer 16. Subsequent processing may include forming additional levels of semiconductor structures such as interconnects upon upper surfaces of the dielectric layer and the contact structures formed within the one or more openings. Therefore, multiple levels of semiconductor structures may be interconnected to form a working semiconductor device.

Figure 8:
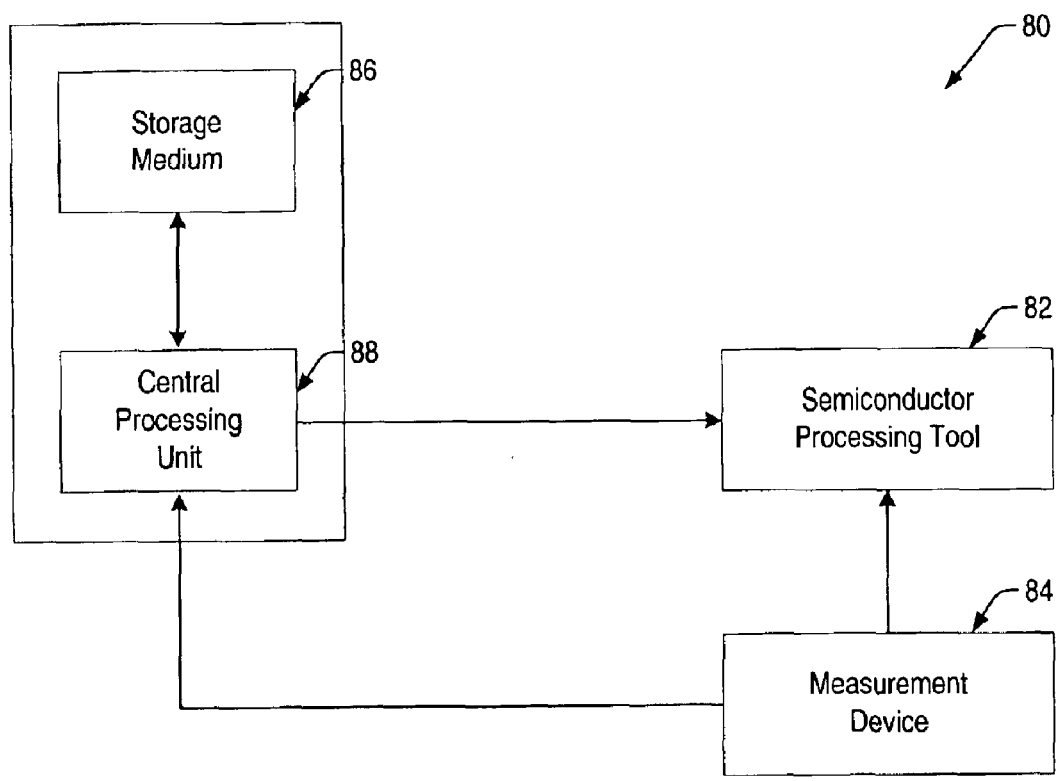
FIG. 8 is a block diagram illustrating an exemplary system for fabricating one or more openings in a semiconductor topography.

In addition, a system is provided herein for fabricating one or more openings in a semiconductor topography. As such, FIG. 8 depicts system 80 as including semiconductor processing tool 82, measurement device 84, storage medium 86, and central processing unit 88. Semiconductor processing tool 82 may be any wet or dry etching tool commonly known in the art, which is adapted to etch the semiconductor topography using adjustable etching parameters. In addition, semiconductor processing tool 82 may be a batch etching tool (i.e., to process several semiconductor wafers at once) or a single wafer etching tool (i.e., to process a single semiconductor wafer at once). For example, semiconductor processing tool 82 may be one of several plasma etching tools commonly used in the semiconductor industry, such as DRM or SCCM from Tokyo Electron Limited, eMAX or Super-E from Applied Material, or Excelan from LAM Research. Note, however, that semiconductor processing tool 82 is not limited to the plasma etching tools listed above, and may alternatively include in any other wet or dry etching tool.

Measurement device 84 may be any optical measurement device, which is adapted to measure one or more dimensional features of a semiconductor topography. In some cases, measurement device 84 may include more than one measurement device depending on the dimensional features to be measured. For example, it may be desirable to measure a thickness of a layer within the semiconductor topography, such as a thickness of dielectric layer 16 of semiconductor topography 5 of FIG. 1. In such an example, measurement device 84 may include one or more optical radiation detection devices, such as a laser interferometry device, a laser reflectometry device, an optical emission spectrometry device, or a simple photodetector adapted to detect a wavelength of light specific to the materials being etched. In some cases, it may be further desirable to measure a width of a feature within the semiconductor topography, such as a width of a gap within a patterned masking layer or a top and bottom lateral width of one or more subsequently formed openings. In such a case, measurement device 84 may also include an optical imaging device, such as a scanning electron microscopy (SEM) device. In general, measurement device 84 may be used to measure the one or more dimensional features before etching (i.e., to obtain pre-etch values) and after etching (i.e., to obtain post-etch values) the one or more openings within the semiconductor topography.

Storage medium 86 may be any storage device, which is adapted to store the measured pre-etch and post-etch values of the one or more dimensional features obtained by measurement device 84. In some cases, storage medium 86 is further adapted to store the measured pre-etch and post-etch values of a plurality of semiconductor topographies, for example, in a historical database of measured values. In some cases, the historical database may include information relating certain pre-etch values to a particular set of etch parameters. For example, the historical database may include information relating a dielectric layer thickness of 6,000 Å to a particular set of etch parameters including, but not limited to, first and second etch chemistry, first and second etch time, flow rate of the first and second etch chemistries and/or flow rate of inert gases added to the etch chemistries, magnetic field strength, and temperature. After etching, the historical database may also be updated with the results (i.e., post-etch values) of etching a semiconductor topography having the certain pre-etch value with the particular set of etch parameters. Thus, incoming pre-etch values may be recorded in the historical database, compared to the pre-etch values of previously processed semiconductor topographies, and assigned updated etch parameters based upon past results of the previously processed semiconductor topographies. Note, that the historical database may further include any other parameters related to the etch process, such as batch numbers, etch chamber pressure, and backside cooling flow rate and pressure.

Central processing unit (CPU) 88 may be any processing device, which is adapted to process the measured pre-etch and post-etch values obtained from measurement device 84 using program instructions stored within storage medium 86. As such, CPU 88 is further adapted to determine whether one or more of the adjustable etching parameters is adjusted prior to etching the semiconductor topography. For example, prior to etching, measurement device 84 is adapted to measure one or more dimensional features of a semiconductor topography to obtain pre-etch values. Such pre-etch values may then be forwarded to CPU 88. In this manner, CPU 88 is adapted to store the pre-etch values in a historical database within storage medium 86, determine a statistical result of the pre-etch values using program instructions within storage medium 86, and compare the statistical result to a target value for the one or more dimensional features of the semiconductor topography. As such, CPU 88 is adapted to adjust the etching parameters prior to etching the semiconductor topography if the statistical result of the pre-etch values is substantially different than the target value.

After etching the semiconductor topography, CPU 88 is further adapted to refine an amount by which the adjustable etching parameters are adjusted for a subsequent semiconductor topography. For example, subsequent to etching, measurement device 84 is adapted to measure one or more dimensional features of the etched semiconductor topography to obtain post-etch values. Such post-etch values may then be forwarded to CPU 88. In this manner, CPU 88 is adapted to store the post-etch values in the historical database within storage medium 86, determine a statistical result of the post-etch values using the program instructions within storage medium 86, and compare the statistical result of the post-etch values to a desired value for the one or more openings. As such, CPU 88 is adapted to refine the amount by which the etching parameters are adjusted for a subsequent semiconductor topography if the statistical result of the post-etch values deviates substantially from the desired value. In general, a minimum deviation of the post-etch values from the desired value dependents on the level of precision of measurement device 84. In some cases, for example, measurement device 84 may be accurate within approximately ±50 Å. In such a case, CPU 88 may refine the amount by which the etching parameters are adjusted if the statistical result of the post-etch values deviates from the desired value by greater than or equal to approximately 50 Å.

It will be appreciated to those skilled in the art having the benefit of this disclosure that this invention is believed to provide a system and method for fabricating one or more openings in a semiconductor topography using feed-forward control of dimensional features within the semiconductor topography. Further modifications and alternative embodiments of various aspects of the invention will be apparent to those skilled in the art in view of this description. For example, the method described herein is not limited to the formation of contact structures, or even limited to the formation of openings within a dielectric layer. Instead, the method could be used to form one or more openings in a conductive semiconductor material to form, for example, isolation regions. Therefore, it is intended that the following claims be interpreted to embrace all such modifications and changes and, accordingly, the specification and drawings are to be regarded in an illustrative rather than a restrictive sense.

What is claimed is:

1. A method for fabricating one or more openings in a semiconductor topography, the method comprising:

measuring one or more dimensional features of the semiconductor topography to obtain pre-etch values;

determining a statistical result of the pre-tech values;

etching the semiconductor topography based on the statistical result to form the one or more openings in the semiconductor topography;

measuring one or more dimensional features of the openings to obtain post-etch values; and determining a statistical result of the post-etch values and comparing the statistical result of the pre-tech values to the statistical result of the post-etch values.

2. The method of claim 1, wherein the step of measuring comprises measuring a thickness of a layer within the semiconductor topography.

3. The method of claim 1, wherein the statistical result is a mean value of the pre-tech values.

4. The method of claim 1, wherein the step of measuring comprises measuring a bottom width of the one or more openings in the semiconductor topography to obtain the post-etch values.

5. The method of claim 1, wherein the step of measuring comprises a width of a gap in a patterned masking layer within the semiconductor topography.

6. The method of claim 5, wherein the step of measuring further comprises measuring a thickness of a layer within the semiconductor topography, and wherein a ratio of the thickness to the width is substantially greater than 4:1.

7. The method of claim 1, prior to the step of etching, the method further comprising adjusting one or more processing parameters if the statistical result is substantially less than a target value.

8. The method of claim 7, wherein the step of adjusting the one for more processing parameters comprises adjusting etch chemistry.

9. The method of claim 7, wherein the step of adjusting the one or more processing parameters comprises adjusting etch time.

10. The method of claim 7, wherein based on said comparing, the method further comprises refining an amount by which the one or more processing parameters are adjusted for a next semiconductor topography with the same statistical result.

11. A method for fabricating one or more openings in a semiconductor topography, the method comprising:

measuring one or more dimensional features of the semiconductor topography to obtain pre-etch values;

determining a statistical result of the pre-etch values;

etching a first portion of a layer within the semiconductor topography, wherein the step of etching a first portion comprises using a first set of etch parameters based upon the statistical result; and etching a second portion of the layer to form the one or more openings within the semiconductor topography, wherein the step of etching a second portion comprises using a second set of etch parameters based upon the statistical result.

12. The method of claim 11, wherein the steps of etching the first and second portions comprise forming the one or more openings to have top lateral widths substantially equal to respective bottom lateral widths.

13. The method of claim 11, wherein the first set of etch parameters comprises a first etch chemistry and a first etch time, and wherein the second set of etch parameters comprises a second etch chemistry and a second etch time.

14. The method of claim 13, wherein the first set of etch parameters is substantially equal to the second set of etch parameters.

15. The method of claim 13, wherein the first set of etch parameters is substantially different from the second set of etch parameters.

16. The method of claim 13, prior to the step of etching the first portion, the method further comprises adjusting one or more parameters of the first and second set of etch parameters upon determining that the statistical result is substantially less than a target value.

17. The method of claim 16, wherein the step of adjusting comprises altering a ratio of the first etch chemistry to the second etch chemistry.

18. The method of claim 16, wherein the step of adjusting comprises altering the first etch time and the second etch time.

19. A system for fabricating one or more openings in a semiconductor topography, the system comprising:

a semiconductor processing tool adapted to etch the semiconductor topography with adjustable etching parameters;

a measurement device adapted to measure one or more dimensional features of the semiconductor topography before and after said etching to obtain pre-etch and post-etch values;

a storage medium adapted to store the pre-etch and post-etch values of the one or more dimensional features; and a central processing unit adapted to execute a plurality of program instructions stored within the storage medium, wherein prior to etching the semiconductor topography, said execution causes the central processing unit to determine whether one or more of the adjustable etching parameters is adjusted for a particular pre-etch value; and wherein subsequent to etching the semiconductor topography, said execution causes the central processing unit to compare the post-etch value with a target value, and based on said comparison refine an amount by which the one or more adjustable etching parameters is adjusted for a next semiconductor topography exhibiting the particular pre-etch value.

20. The system of claim 19, wherein the storage medium is further adapted for storing a historical database comprising pre-etch and post-etch values of a plurality of semiconductor topographies and the adjustable etching parameters associated therewith.

21. The system of claim 20, wherein the central processing unit is adapted to refine the amount by which the one or more adjustable etching parameters is adjusted based on the historical database.

* * * * *

UNITED STATES PATENT AND TRADEMARK OFFICE
CERTIFICATE OF CORRECTION

PATENT NO. : 6,893,974 B1
DATED : May 17, 2005
INVENTOR(S) : Sedigh et al.

It is certified that error appears in the above-identified patent and that said Letters Patent is hereby corrected as shown below:

<u>Column 25,</u>
Lines 6, 14 and 20, delete "pre-tech" and substitute -- pre-etch --.

Signed and Sealed this

Third Day of January, 2006

JON W. DUDAS
*Director of the United States Patent and Trademark Office*